United States Patent [19]
Yamazaki

[11] Patent Number: 6,144,057
[45] Date of Patent: *Nov. 7, 2000

[54] SEMICONDUCTOR MEMORY DEVICE INCLUDING A FIELD EFFECT TRANSISTOR

[75] Inventor: Shunpei Yamazaki, Tokyo, Japan

[73] Assignee: Semiconductor Energy Laboratory Co., Ltd., Kanagawa, Japan

[*] Notice: This patent is subject to a terminal disclaimer.

[21] Appl. No.: 08/857,556

[22] Filed: May 16, 1997

Related U.S. Application Data

[62] Division of application No. 08/250,344, May 27, 1994, Pat. No. 5,665,210, which is a continuation of application No. 08/041,520, Mar. 30, 1993, abandoned, which is a continuation of application No. 07/729,533, Jul. 15, 1991, abandoned.

[30] Foreign Application Priority Data

| Jul. 24, 1990 | [JP] | Japan | 2-195174 |
| Jul. 24, 1990 | [JP] | Japan | 2-195175 |
| Jul. 24, 1990 | [JP] | Japan | 2-195176 |

[51] Int. Cl.$^7$ .................................. H01L 31/119
[52] U.S. Cl. .................. 257/306; 257/295; 257/310
[58] Field of Search .................. 257/295, 316, 257/905, 306, 310; 365/145

[56] References Cited

U.S. PATENT DOCUMENTS

| 3,607,679 | 9/1971 | Melroy et al. | 204/192.22 X |
| 3,607,697 | 9/1971 | Shirn et al. | 204/192.23 |
| 3,616,400 | 10/1971 | Wasa et al. | 204/192.22 X |

(List continued on next page.)

FOREIGN PATENT DOCUMENTS

| 349187 | 3/1990 | European Pat. Off. . |
| 445535 | 11/1991 | European Pat. Off. . |
| 26-40078 | 7/1990 | France . |
| 59-99726 | 6/1984 | Japan . |
| 60-57634 | 4/1985 | Japan . |
| 62-23117 | 1/1987 | Japan . |
| 02-61128 | 11/1987 | Japan . |
| 62-269363 | 11/1987 | Japan . |
| 62-298119 | 12/1987 | Japan . |
| 63-199456 | 8/1988 | Japan . |
| 64-82557 | 3/1989 | Japan . |
| 1-171275 | 7/1989 | Japan . |
| 1-203666 | 8/1989 | Japan . |
| 1-225148 | 9/1989 | Japan . |
| 1-248557 | 10/1989 | Japan . |
| 2-47256 | 2/1990 | Japan . |
| 2-79475 | 3/1990 | Japan . |
| 3-16129 | 1/1991 | Japan . |
| 3-79028 | 4/1991 | Japan . |
| 4-61337 | 2/1992 | Japan . |
| 10-96925 | 12/1967 | United Kingdom . |
| 2 103 879A | 8/1981 | United Kingdom . |
| WO 89/02655 | 3/1989 | WIPO . |

OTHER PUBLICATIONS definition from Merriam Webster Collegiate Dictionary, Tenth Edition.

Mizuno et al., "High Speed and HIghly Reliable Trench MOSFET with Dual Gate", Symp. VLSI Tech. Dig. (1988), pp. 23–24.

IEDM Dec. 11–14, 1988, pp. 222–225, San Franisco, Calif., U.S.; H. Takato et al; "High Performance CMOS SUrrounding Gate Transistor (SGT) for Ultra High Density LSIs".

(List continued on next page.)

Primary Examiner—Sara Crane
Attorney, Agent, or Firm—Nixon Peabody LLP; Gerald J. Ferguson, Jr.; Jeffrey L. Costellia

[57] ABSTRACT

A semiconductor memory device including a field effect transistor associated with a semiconductor substrate and a capacitor. The capacitor is connected to a drain region of the transistor. Specifically, the capacitor includes a dielectric layer including a ferroelectric material. The capacitor is located above a gate electrode of the transistor and completely overlaps the gate electrode. The device may also include a pair of field effect transistors wherein each source of the transistors shares a common impurity doped region of the semiconductor substrate.

19 Claims, 4 Drawing Sheets

U.S. PATENT DOCUMENTS

| | | | |
|---|---|---|---|
| 3,763,026 | 10/1973 | Cordes | 204/192.23 X |
| 4,250,519 | 2/1981 | Mogi et al. | 357/41 |
| 4,350,537 | 9/1982 | Young et al. | 427/554 X |
| 4,427,723 | 1/1984 | Swain | 427/559 X |
| 4,515,668 | 5/1985 | Brownell et al. | 204/192.22 |
| 4,539,431 | 9/1985 | Moddel et al. | 427/559 X |
| 4,554,570 | 11/1985 | Jastrzebski et al. | 357/23.4 |
| 4,581,248 | 4/1986 | Roche | 427/554 |
| 4,624,736 | 11/1986 | Gee et al. | 427/554 X |
| 4,649,406 | 3/1987 | Takemae et al. | 357/23.6 |
| 4,732,659 | 3/1988 | Schachter et al. | 204/192.22 X |
| 4,734,384 | 3/1988 | Tsuchiya | 437/52 |
| 4,786,953 | 11/1988 | Morie et al. | 357/23.4 |
| 4,790,920 | 12/1988 | Krzanich | 204/192.22 X |
| 4,804,640 | 2/1989 | Kaganowicz et al. | 204/192.22 X |
| 4,818,715 | 4/1989 | Chao | 437/44 |
| 4,819,043 | 4/1989 | Yazawa et al. | 357/23.3 |
| 4,845,539 | 7/1989 | Inoue | 357/23.6 |
| 4,849,081 | 7/1989 | Ross . | |
| 4,883,543 | 11/1989 | Gossen, Jr. et al. | 437/52 X |
| 4,888,630 | 12/1989 | Paterson | 257/316 |
| 4,891,327 | 1/1990 | Okumura | 437/41 |
| 4,906,328 | 3/1990 | Freeman et al. | 427/554 X |
| 4,920,065 | 4/1990 | Chin et al. | 437/52 |
| 4,931,897 | 6/1990 | Tsukamoto et al. | 361/313 |
| 4,937,641 | 6/1990 | Sunami et al. | 357/23.6 |
| 4,951,175 | 8/1990 | Kurosawa et al. | 437/52 X |
| 4,963,504 | 10/1990 | Huang | 437/44 |
| 4,975,383 | 12/1990 | Baglee | 437/43 |
| 4,987,008 | 1/1991 | Yamazaki et al. | 427/554 |
| 5,006,481 | 4/1991 | Chan et al. | 437/52 |
| 5,017,504 | 5/1991 | Nishimura et al. | 437/40 |
| 5,027,173 | 6/1991 | Satoh | 357/23.6 |
| 5,032,882 | 7/1991 | Okumura et al. | 357/23.6 |
| 5,043,298 | 8/1991 | Yamada et al. | 437/52 |
| 5,047,359 | 9/1991 | Nagatomo | 437/35 |
| 5,047,812 | 9/1991 | Pfiester | 357/23.4 |
| 5,053,842 | 10/1991 | Kojima | 357/23.5 |
| 5,056,010 | 10/1991 | Huang | 364/200 |
| 5,086,010 | 2/1992 | Kimura | 437/53 |
| 5,109,357 | 4/1992 | Eaton, Jr. | 365/145 |
| 5,136,534 | 8/1992 | McDavid et al. | 257/295 |
| 5,181,088 | 1/1993 | Mikata et al. | 257/331 |
| 5,189,503 | 2/1993 | Suguro et al. . | |
| 5,203,929 | 4/1993 | Takayanagi et al. | 427/559 X |
| 5,213,997 | 5/1993 | Ishihara et al. | 427/554 X |
| 5,302,843 | 4/1994 | Yamazaki . | |
| 5,403,763 | 4/1995 | Yamazaki . | |
| 5,464,780 | 11/1995 | Yamazaki . | |
| 5,561,311 | 10/1996 | Hamamoto et al. | 257/309 |
| 5,587,340 | 12/1996 | Yamazaki | 437/203 |

OTHER PUBLICATIONS

Young et al., "Correlation . . . $Ta_2O_5$ films", J. Fac. Sci. Technol., vol. 14, No. 1, Jan./Feb. 1977.

Schreiber et al., J. Electrochem Soc., vol. 123, No. 1, pp. 30–33 (1976).

Suyama et al., "Electrical Conduction Mechanism and Breakdown Property in Sputter–Deposited Silicon Dioxide Films on Polycrystalline Silicon", J. Appl. Phys. vol. 65, No. 1, Jan. 1, 1989, pp. 210–214.

Jones et al., "Effect of Oxygen on the rf–Sputtering Rate of $SiO_2$", J. Vacuum Sci. and Technology, vol. 5, No. 3, pp. 84–87.

Kozuma et al., "Some Properties of Silica Film Made by RF Glow Discharge Sputtering", J. Jap of Appl. Phys., vol. 9, No. 8, Aug. 1970, pp. 983–91.

Suyama et al., Chem. Abstracts 109573w, Mar. 12, 1990, p. 750.

Young et al., "Effect of Pulse Duration on the Annealing of Ion Implanted Silicon With a XeCl Excimer Laser and Solar Cells", Mat. Res. Soc. Symp. Proc., vol. 13, 1983, pp. 401–406.

Schreiber et al., "High Quality RF–Sputtered Silicon Dioxide Layers", J. Electrochem. Soc., vol. 123, No. 1, 1976, pp. 30–31.

SEMICONDUCTOR MEMORY DEVICE INCLUDING A FIELD EFFECT TRANSISTOR

This is a Divisional application of Ser. No. 08/250,344, filed May 27, 1994 now U.S. Pat. No. 5,665,210; which itself is a continuation of Ser. No. 08/041,520, filed Mar. 30, 1993, now abandoned; which itself is continuation of Ser. No. 07/729,533, filed Jul. 15, 1991, now abandoned.

BACKGROUND OF THE INVENTION

The present invention relates to a method of forming insulating films in general. More particularly, it relates to such a method of sputtering suitable for forming excellent dielectric films suitable for use in capacitances.

In the recent years, dielectric (insulating) films deposited by CVD have been utilized to form capacitances for use in integrated semiconductor devices. The employment of CVD makes it possible to deposit dielectric films at low temperatures up to 450° C. so that inexpensive substrates such as soda lime glass or borosilicate glass substrates can be used. Similar low temperature deposition can be accomplished also by plasma CVD and sputtering in an atmosphere comprising an inert gas such as argon at a density of 100% to 80%. The use of argon has been known to increase the sputtering yield.

In accordance with experiments of the inventor, it has been found that the number of the interface states occurring between the dielectric film and the underlying electrical active region seriously depends upon the argon density of the sputtering atmosphere. A conspicuous example is the case of dielectric films made of tantalum oxide. In this case, many clusters of tantalum atoms of 5 to 50 Å diameter are formed in the oxide film due to stability of metal tantalum. It has been also found that the argon density significantly influences the difference in flat band voltage from the ideal value which indicates the degradation of the film and reflects the state number of fixed charge and the clusters.

There are other attempts to form dielectric films by the use of photo-CVD. In this case, the underlying surface is less damaged and the density of interface states is as low as $2 \times 10^{10}$ $eV^{-1}$ $cm^{-2}$. On the other hand, the deposition of photo-CVD takes much time to complete due to very slow deposition speed so as not to be utilized for massproduction. Furthermore, the long-term reliability is not sure because of hot-electron effect resulting from hydrogen utilized during deposition.

BRIEF SUMMARY OF THE INVENTION

It is an object of the present invention to provide a method of forming high quality insulating films by deposition at low temperatures suitable for use in capacitances.

It is another object of the present invention to provide a method of forming high quality insulating films having high reliability.

It is a further object of the present invention to provide a method of forming a semiconductor device having high reliability.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a dielectric material or an insulating material is sputtered on a substrate in a particularly appropriate atmosphere. Unlike conventional process, the atmosphere is characterized in that no or small proportion of an inert gas, typically argon, is utilized. The inventors have presumed that the disadvantages of argon atoms include stoichiometric disturbance in the product of sputtering and damage or defects caused by collision of argon ions or argon atoms with the dielectric film resulting in formation of fixed charge.

In the case of sputtering of a metal oxide such as tantalum oxide, titanium oxide or other suitable oxide dielectric materials and barium titanate, lead titanate or similar ferroelectric materials, the inside of a sputtering apparatus is filled with an oxidizing gas containing an inert gas at 25 vol. % or less, e.g. a mixture of oxygen (100% to 75% in volume) and argon (0% to 25% in volume). Other suitable oxidizing gases include $N_2O$ and $O_3$. Particularly, in the case of $O_2$ or $O_3$, unnecessary atoms are not introduced into the oxide film resulting in few pinholes, little damage to dielectric properties and decreased dispersion in dielectric strength. $O_3$ tends to be decomposed to yield oxygen radicals which enhance progress of the deposition. Usually, a bulk of a desired one of these oxides is used as the target of the sputtering. A simple metal such as tantalum can be also used as the target by suitably selecting the sputtering condition as explained in the following detailed description.

In the case of sputtering of nitrides, e.g. insulating nitrides such as silicon nitride and aluminum nitride, or resistive nitrides such as tantalum nitride, titanium nitride or other suitable nitride, the inside of a sputtering apparatus is filled with a nitride compound gas containing an inert gas at 50 vol. % or less, preferably 25 vol. % or less, e.g. a mixture of nitrogen (100 vol. % to 75 vol. %) and argon (0 vol. % to 25 vol. %). Other suitable nitride compound gases include ammonia ($NH_3$). Particularly, when very pure nitrogen such as vaporized from liquid nitrogen is used, unnecessary atoms are not introduced into the nitride film resulting in few pinholes, little damage to dielectric property and small dispersion in dielectric strength.

The quality of insulating films can be furthermore improved by using a halogen which would terminate dangling bonds and neutralize alkali ions inadvertently introduced into the films. In this case, a halogen compound gas is introduced together with the process gas into the sputtering apparatus at 0.2 to 20 vol %. The halogen compound gases include fluorine compounds such as $NF_3$, $N_2F_4$, HF, chloro-fluoro carbon and $F_2$ and chlorine compounds such as $CCl_4$, $Cl_2$ and HCl. If the halogen is introduced too much, the content of the insulating film might be altered. The concentration of the halogen are limited to 0.01 to 5 atom % in general.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1A:
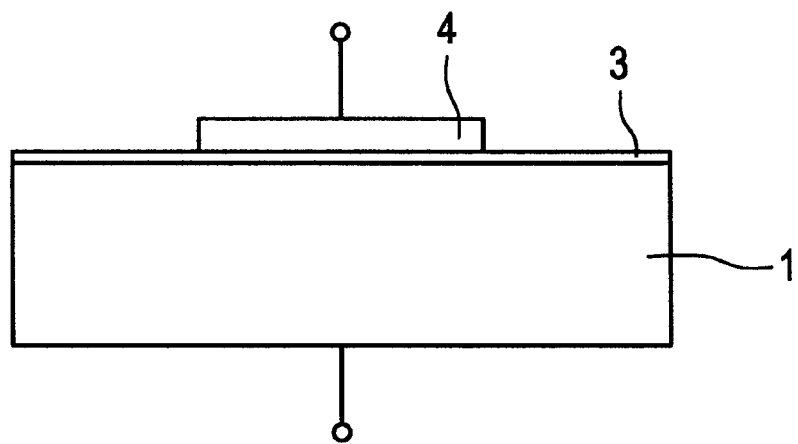
FIG. 1(A) is a side view showing a MIS (metal-insulator-semiconductor) device manufactured in accordance with a first embodiment of the present invention.
Figure 1B:
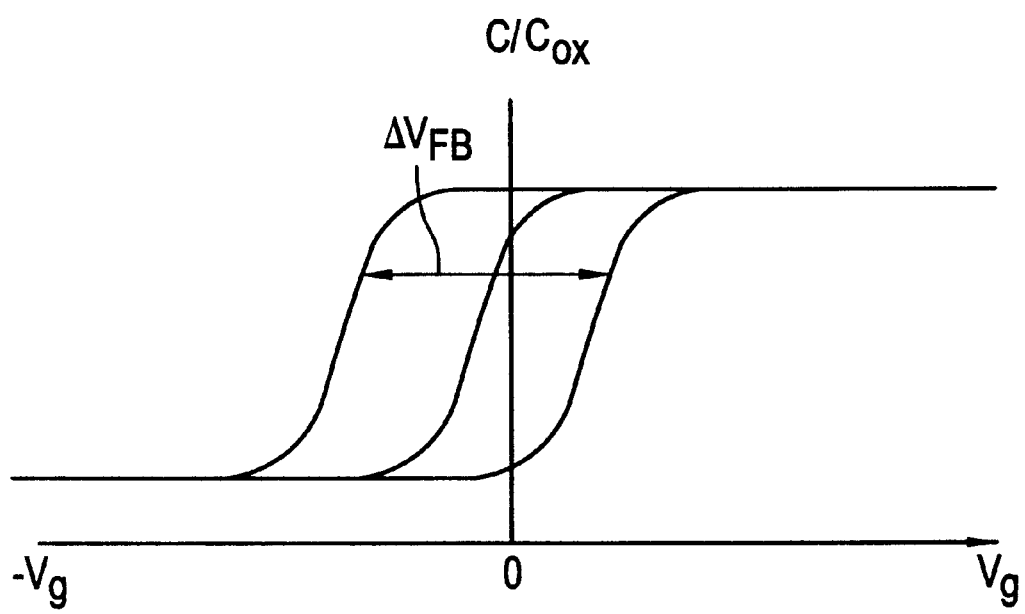
FIG. 1(B) is a graphical diagram for explaining the displacement of the flat band voltage.
Figure 2:
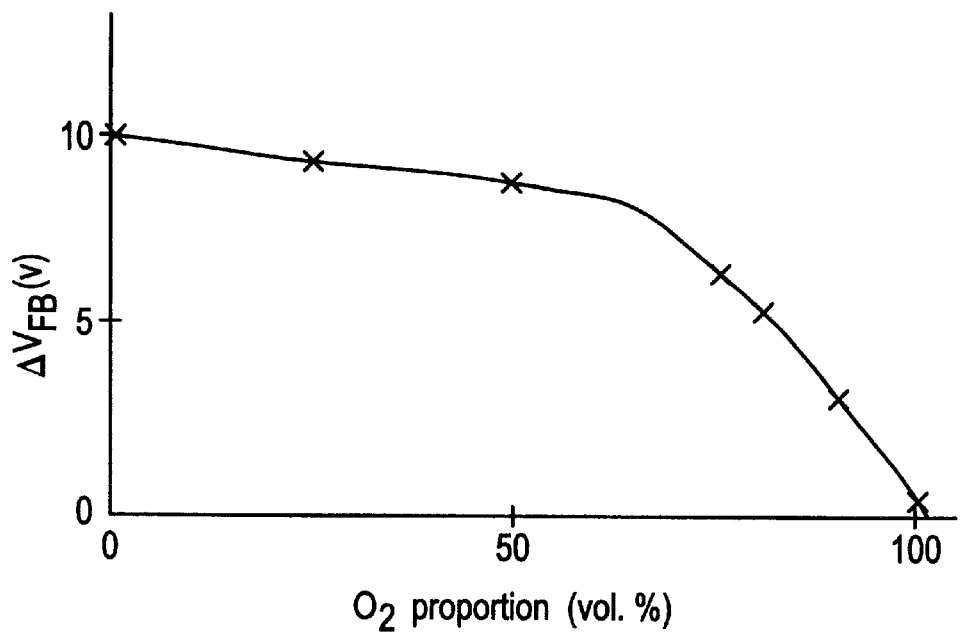
FIG. 2 is a graphical diagram showing the displacement of the flat band voltage versus the argon proportion to an argon and $O_2$ mixture in the sputtering atmosphere.

Referring now to FIGS. 1(A) and 1(B) and FIG. 2, a method of manufacturing an insulating film in accordance with a first embodiment of the present invention will be explained. A substrate 1 made of a single crystalline silicon semiconductor is disposed on a substrate holder in an RF magnetron sputtering apparatus (not shown) in which a target of $Ta_2O_5$ has been mounted on a target holder in advance. After evacuating the inside of the apparatus, a gas is introduced thereinto in order to prepare a suitable atmosphere for gas discharge. The gas comprises argon and an oxidizing gaseous compound such as oxygen. Desirably, the constituent gases have 99.999% or higher purities. A tantalum oxide film 3 (insulating film) is then sputtered on the substrate 1 by causing gas discharge between the target holder and the substrate holder. After completion of deposition, the substrate 1 is removed from the apparatus and coated with a round aluminum electrode 4 having a 1 mm diameter by electron beam evaporation.

The characteristics of such insulating film in the MIS structure (Al—$Ta_2O_5$—Si) can be evaluated by displacement $\Delta V_{FB}$ of the flat band voltage through measuring the flat band voltage. For the measurement of the displacement, the insulating film is given BT (bias-temperature) treatment with a negative bias voltage of $2 \times 10^6$ V/cm at 150° C. for 30 minutes followed by measuring the flat band voltage $V_{FB1}$, and thereafter BT treatment with a positive bias voltage of $2 \times 10^6$ V/cm at 150° C. for 30 minutes followed by measuring the flat band voltage $V_{FB2}$ again. The displacement $\Delta V_{FB}$ is $|V_{FB1} - V_{FB2}|$ as illustrated in FIG. 1(B).

The above procedure of deposition was repeated by changing the proportion of argon to oxygen from 100% to 0% for reference. The displacements $\Delta V_{FB}$ measured are plotted on a graphical diagram shown in FIG. 2. As shown in the diagram, the displacements $\Delta V_{FB}$ significantly decreased below 5 V when the argon proportion was decreased to 25% or lower. When argon was not used, i.e. pure oxygen (100%) was used, the displacements $\Delta V_{FB}$ was only 0.5 V or lower. Contrary to this, when pure argon (100%) was used, the displacements $\Delta V_{FB}$ was increased to 10 V. The displacements $\Delta V_{FB}$ was furthermore abruptly decreased to several tenths thereof by utilizing an additive of a halogen. The introduction of a halogen is carried out by introducing into the sputtering apparatus, together with oxygen, a halogen compound gas such as a nitrogen fluoride ($NF_3$, $N_2F_4$) at 0.2 to 20 vol %. Particularly, $NF_3$ is most preferred because $NF_3$ can be handled with a little care and decomposed by small energy.

Figure 3A:
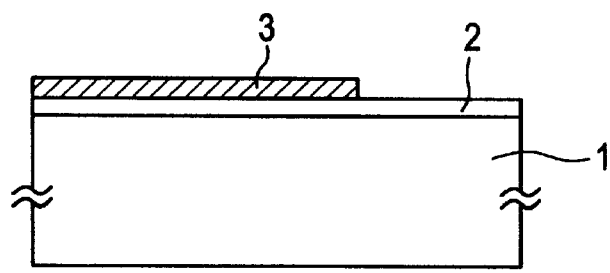
FIGS. 3(A) and 3(B) are side views showing a capacitance manufactured in accordance with a second embodiment of the present invention.
Figure 3B:
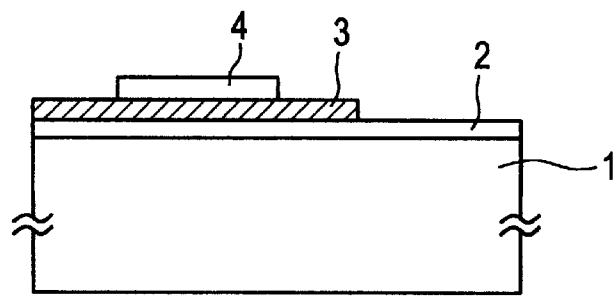

Referring next to FIG. 3, a method of manufacturing an insulating film in accordance with a second embodiment of the present invention will be explained. A substrate 1 comprising a sodalime glass plate and a $SiO_2$ blocking film formed thereon is disposed in a sputtering apparatus in which a target of metal tantalum has been set up in advance. After evacuating the inside of the apparatus, a gas is introduced thereinto for gas discharge. The gas comprises argon. A tantalum film 2 in the form of an island (lower electrode) is sputtered on the substrate to a thickness of 2000 Å on the substrate 1 with the aid of a metallic mask by causing gas discharge between the target holder and the substrate holder. Alternatively, a known photolithography may be utilized instead of the use of the metallic mask. The substrate temperature is 350° C. The pressure of the gas is maintained at 0.06 Torr during deposition. The input Rf energy is 100 W at 13.56 MHz.

After completion of deposition of the lower electrode 2, the gas is replaced by a mixture of oxygen (100 vol % to 0 vol %) and argon (0 vol % to 100 vol %). The Ta target is also replaced by a $Ta_2O_5$ target having a 99.99% or higher purity. A tantalum oxide film 3 (insulating film) is then deposited on the lower electrode 2 by sputtering associated with gas discharge between the target holder and the substrate holder. The substrate temperature is 100° C. The pressure of the gas is maintained at 0.05 Torr during deposition. The input Rf energy is 500 W at 13.56 MHz. The distance between the substrate 1 and the target is adjusted to be 150 mm. After completion of deposition, the substrate 1 is removed from the apparatus and coated with around aluminum film 4 (upper electrode) having a 1 mm diameter by electron beam evaporation in order to form a capacitance comprising the lower and upper electrodes 2 and 4 and the interposed insulating (dielectric) film 3.

The characteristics of such a capacitance were also evaluated by measuring the displacement $\Delta V_{FB}$ of the flat band voltage. When 100% oxygen was used, a very excellent capacitance was formed. Even if argon was used up to 25%, capacitances having equivalent qualities were formed by setting the distance between the substrate 1 and the target to be larger than the appropriate value for the case of deposition using pure oxygen. Accordingly, excellent capacitances can be formed by utilizing a mixture of oxygen (100 vol % to 25 vol %) and argon (0 vol % to 75 vol %). The quality of such insulating films can be furthermore improved by introducing a halogen in the same manner as explained in conjunction with the first embodiment. In this case, the introduced halogen atoms can be activated by flash annealing using excimer laser pulses so that dangling bonds occurring in the film are neutralized by the halogen atoms and the origin of fixed charge in the film is eliminated.

Figure 4:
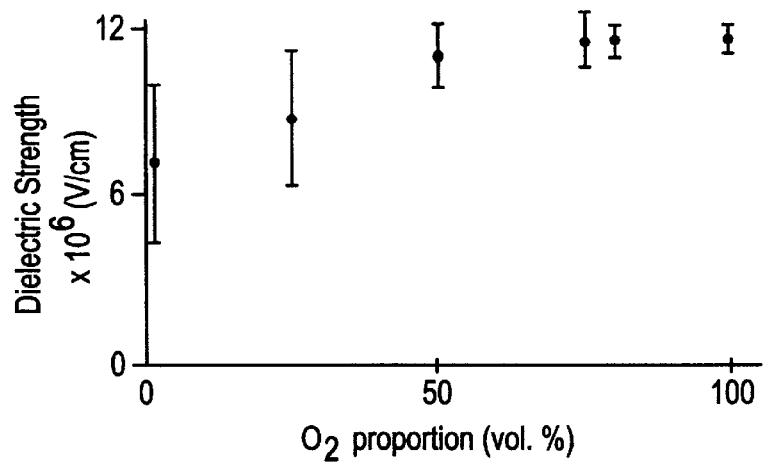
FIG. 4 is a graphical diagram showing the dielectric strength versus the argon proportion in the sputtering atmosphere.
Figure 5:
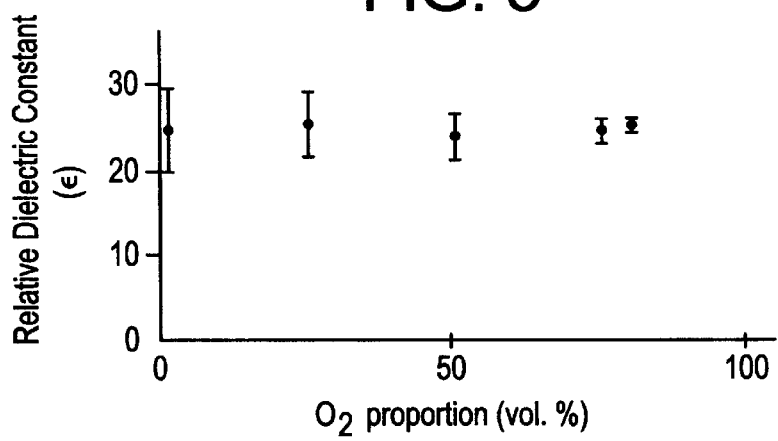
FIG. 5 is a graphical diagram showing the relative dielectric constant versus the argon proportion in the sputtering atmosphere.

FIG. 4 is a graphical diagram showing the relationship between the dielectric strength of the film 3 and the oxygen proportion to the argon-oxygen mixture. The dielectric strength is measured as the threshold voltage when the current leakage exceeds 1 $\mu A$. In this diagram, the length of vertical lines corresponds to double the standard deviations $\sigma(X)$ and given center dots indicative of averages respectively. As shown in the diagram, the $\sigma(X)$ decreased and the average dielectric strengths increased as the proportion increased beyond 75%. FIG. 5 is a graphical diagram showing the relationship between the relative dielectric constant of the film 3 and the oxygen proportion to the argon-oxygen mixture in the same manner. In this diagram, it is also understood that high proportions of oxygen are advantageous resulting in small dispersions.

Figure 6:
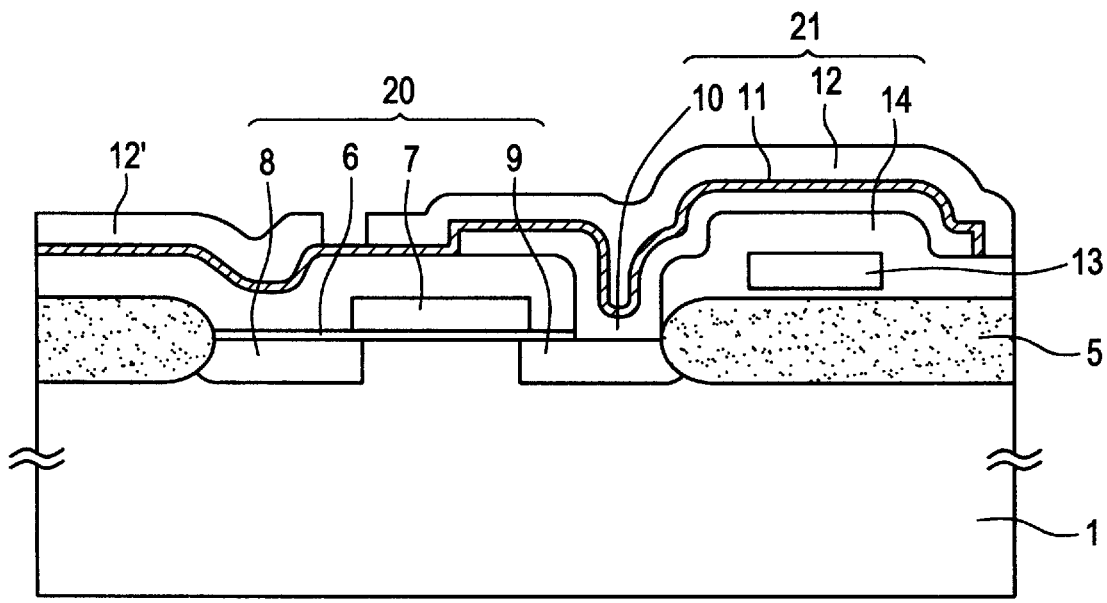
FIG. 6 is a cross sectional view showing a DRAM provided with a capacitance manufactured in accordance with the first or second embodiment of the present invention.

Referring next to FIG. 6, a suitable application of the insulating film formed in accordance with the first or second embodiment of the present invention will be explained. The insulating film is used to form storage capacitances coupled with gate insulated field effect transistors for constructing a DRAM (dynamic random access memory) of 1 Tr/Cell type.

A storage element of the DRAM is of a stacked type as illustrated in FIG. 6 and comprises an n-type silicon semiconductor substrate within which a source and drain regions 8 and 9 of p-type are formed in order to define a channel region therebetween, a field insulating film 5 (LOCOS) for insulating the element from adjacent elements, a gate electrode 7 formed on the channel region through a gate insulating film 6 formed by thermal oxidation or sputtering of silicon oxide in 100% oxygen, an interlayer insulation film 14, a lower electrode 10 made of a silicon semiconductor heavily doped with phosphorus, a dielectric (insulating) film 11 and an upper electrode 12 formed of an aluminum film or a dual film comprising an aluminum layer and a tantalum layer.

The lower electrode 10 may be formed of metal tantalum, tungsten, titanium, molybdenum or any of silicides of such metals and makes electric contact with the drain region 9 through an opening formed in the interlayer film 14. The dielectric film 11 is formed of a $Ta_2O_5$ film deposited by sputtering to a thickness of 300 Å to 3000 Å, typically 500 Å to 1500 Å, e.g. 1000 Å in accordance with the first or second embodiment as described above. The gate insulating film 6 can be made also from $Ta_2O_5$ in place of silicon oxide. In that case, the number of interface states is as small as $2 \times 10^{10}$ $cm^{-2}$. A storage capacitance is formed of the upper and lower electrodes 10 and 12 and the dielectric film 11 located therebetween. The formation of trapping centers of hot carriers can be avoided by forming these electrodes 10 and 12 and the dielectric film 11 in an atmosphere which has been deprived of hydrogen, which otherwise could reach to the gate insulating film by drifting (diffusion). The channel length of the element is selected between 0.1 $\mu$m and 1.0 $\mu$m, e.g. 0.5 $\mu$m so that one storage element can be formed within an area of 20 $\mu$m square. The source region 8 is connected to a bit line for example, and in that case the gate electrode 7 is connected to an address line of the memory. Such miniaturized structure becomes possible due to the large storage capacitance originating from the large relative dielectric constant (=27) of the tantalum oxide film as compared to the relative dielectric constant (=3.8) of silicon oxide. The large relative dielectric constant makes it possible to increase the thickness of the dielectric film to, e.g. 1000 Å so that electric insulation is improved and the number of pinholes is decreased. The frequency property of the tantalum oxide film is also excellent and maintained even at high frequencies. In the figure, numeral 12' designates an extension of the upper electrode of an adjacent storage element. Numeral 13 is the bit line of an adjacent element.

Figure 7:
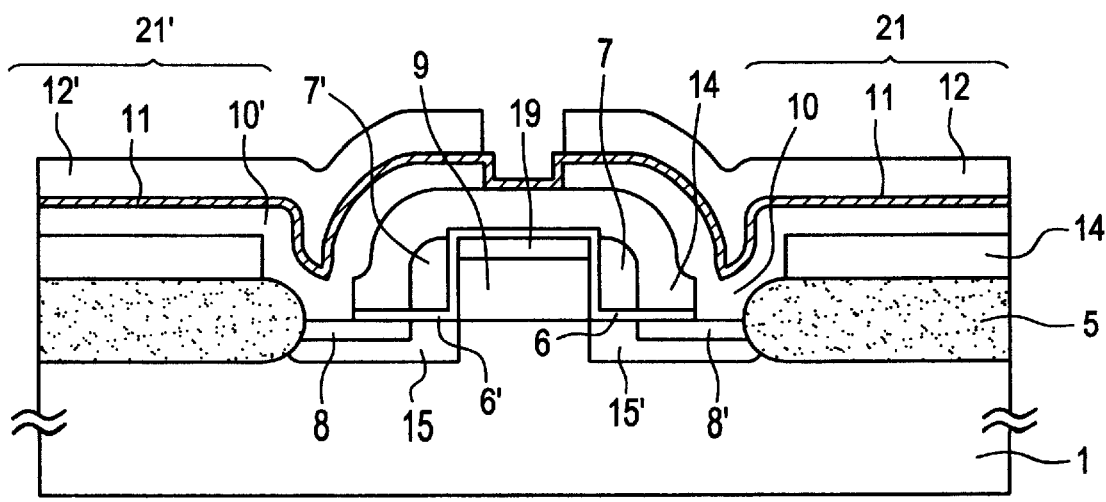
FIG. 7 is a cross sectional view showing another example of DRAM provided with a capacitance manufactured in accordance with the first or second embodiment of the present invention.

Referring next to FIG. 7, another application of the insulating film formed in accordance with the first or second embodiment of the present invention will be explained. The insulating film is used to form storage capacitances for a DRAM (dynamic random access memory) of 1 transistor per cell type.

A storage unit element of the DRAM illustrated in FIG. 7 can store information of two bits. The element comprises a p-type silicon semiconductor substrate within which a pair of channel regions 15 and 15' of n-type and a pair of drain regions 8 and 8' of p-type are formed, a plateau of a p-type semiconductor material forming a source region 9 located between the channel regions 15 and 15', a source electrode 19 formed on the plateau, a pair of gate electrodes 7 and 7' formed on the channel regions 15 and 15' through a gate insulating film 6 and flanking the side surface of the source region 9, a field insulating film 5 (LOCOS) for insulating the element from adjacent elements, an interlayer insulation film 14, a pair of lower electrodes 10 and 10' made of silicon semiconductor heavily doped with phosphorus, a dielectric (insulating) film 11 and a pair of upper electrodes 12 and 12' formed of an aluminum film or a dual film comprising an aluminum layer and a tantalum layer. The channel regions 15 and 15' are formed by ion implantation of boron with a mask of the plateau 9 and 19 and the field insulating film 5 to a density of $1 \times 10^{15}$ $cm^{-3}$ to $5 \times 10^{16}$ $cm^{-3}$, in advance of the formation of the gate electrodes 7 and 7', followed by ion implantation of phosphorus into the regions 8 and 8' with a mask of the plateau 9 and 19, the field insulating film 5 and the gate electrodes 7 and 7' to a density of $1 \times 10^{19}$ $cm^{-3}$ to $1 \times 10^{21}$ $cm^{-3}$.

The lower electrodes 10 and 10' make electric contact with the drain regions 8' and 8 through openings formed in the interlayer film 14 respectively. The dielectric film 11 is formed of a $Ta_2O_5$ film deposited by sputtering to a thickness of 300 Å to 3000 Å, typically 500 Å to 1500 Å, e.g. 1000 Å in accordance with the first or second embodiment as described above in the same manner as that of the previous application. The lower electrode may be formed of metal tantalum, tungsten, titanium, molybdenum or any of silicides of these metals in place of the doped silicon semiconductor. A pair of storage capacitances 21 and 21' are formed from the upper and lower electrodes 10, 10' and 12, 12' and the dielectric film 11 therebetween. The channel length of the element is selected between 0.1 $\mu$m and 1.0 $\mu$m, e.g. 0.5 $\mu$m so that a two bit storage element can be formed within an area of 10 to 20 $\mu$m square.

Next, a method of manufacturing an insulating film in accordance with a third embodiment of the present invention will be explained. FIG. 1(A) is used again for this purpose. A substrate 1 made of a single crystalline silicon semiconductor is disposed on a substrate holder in an RF magnetron sputtering apparatus (not shown) in which a target of $Si_3N_4$ has been mounted on a target holder in advance. Alternatively, the target may be made of other nitrides such as aluminum nitride, tantalum nitride, titanium nitride instead of the $Si_3N_4$ target. After evacuating the inside of the apparatus, a gas is introduced thereinto in order to prepare a suitable atmosphere for gas discharge. The gas comprises argon and a nitrogen compound gas such as nitrogen. Desirably, the constituent gases have 99.9% or higher purities. The substrate temperature is 200° C. The pressure of the gas is maintained at 0.05 Torr during deposition. The input Rf energy is 500 W at 13.56 MHz. The distance between the substrate 1 and the target is adjusted to be 150 mm. A silicon nitride film 3 (insulating film) is then sputtered on the substrate 1 by causing gas discharge between the target holder and the substrate holder. After completion of deposition, the substrate 1 is removed from the apparatus and coated with a round aluminum electrode 4 having a 1 mm diameter by electron beam evaporation.

The characteristics of such insulating film in the MIS structure (Al—$Si_3N_4$—Si) can be evaluated by displacement $\Delta V_{FB}$ of the flat band voltage through measuring the flat band voltage. For the measurement of the displacement, the insulating film is given BT (bias-temperature) treatment with a negative bias voltage of $2\times10^6$ V/cm at 150° C. for 30 minutes followed by measuring the flat band voltage, and thereafter BT treatment with a positive bias voltage of $2\times10^6$ V/cm at 150° C. for 30 minutes followed by measuring the flat band voltage again in the same manner as for oxide films.

Figure 8:
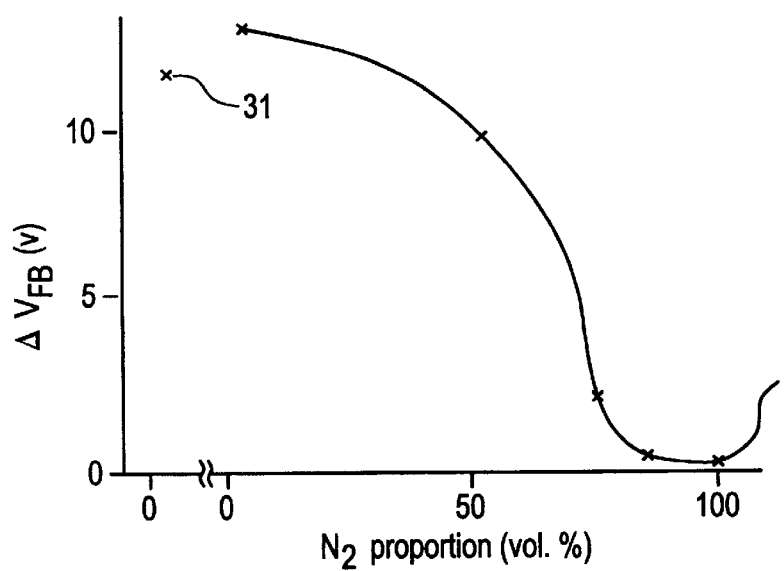
FIG. 8 is a graphical diagram showing the displacement of the flat band voltage versus the argon proportion to an argon and $N_2$ mixture in the sputtering atmosphere.

The above procedure of deposition was repeated by changing the proportion of argon to nitrogen from 100% to 0% for reference. The displacements $\Delta V_{FB}$ measured are plotted on a graphical diagram shown in FIG. 8. As shown in the diagram, the displacements $\Delta V_{FB}$ significantly decreased below 2 V when the argon proportion was decreased to 25% or lower. Numeral 31 designates a displacement of 11.5 V in the case of a silicon nitride film deposited by a conventional plasma CVD for reference. When argon was not used, i.e. pure nitrogen (100%) was used, the displacements $\Delta V_{FB}$ was only 0.5 V or lower as depicted by numeral 34. Contrary to this, when pure argon (100%) was used, the displacements $\Delta V_{FB}$ was increased to 13 V. The displacements $\Delta V_{FB}$ was furthermore abruptly decreased to several tenths thereof by utilizing an additive of a halogen. The introduction of a halogen is carried out by introducing into the sputtering apparatus, together with nitrogen, a halogen compound gas such as a nitrogen fluoride ($NF_3$, $N_2F_4$) at 0.2 to 20 vol %. In this case, the introduced halogen atoms can be activated by flash annealing using excimer laser pulses so that dangling bonds occurring in the film are neutralized by the halogen atoms and the origin of fixed charge in the film is eliminated.

Referring again to FIGS. 6 and 7, suitable applications of the insulating film formed in accordance with the third embodiment of the present invention will be explained. The insulating film is used also in this case to form storage capacitances for DRAMs (dynamic random access memory) of 1 Tr/Cell type. The explanation is substantially same as given to the above applications utilizing the tantalum oxide insulating films except for the following description.

The dielectric film 11 as illustrated in FIGS. 6 and 7 is formed of a $Si_3N_4$ film in this case deposited by sputtering to a thickness of 300 Å to 3000 Å, typically 500 Å to 1500 Å, e.g. 1000 Å in accordance with the third embodiment as described above. The gate insulating film 6 can be made also from $Si_3N_4$ in place of silicon oxide. In that case, the number of interface states is as small as $3\times10^{10}$ cm$^{-2}$. The dimension of the unit elements can be decreased in the same manner as in the applications utilizing the tantalum oxide films due to the large storage capacitance originating from the large relative dielectric constant (=6) of the silicon nitride film as compared to the relative dielectric constant (=3.8) of silicon oxide.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

Although the dielectric films are deposited by RF magnetron sputtering in the above preferred embodiments, other suitable sputtering can be utilized, e.g. various known types of DC or RF sputtering methods. It is partly because of the high resistance of the targets utilized that RF magnetron sputtering is preferred. Pure metals such as tantalum and titanium, however, may be used in suitable sputtering conditions. In the case of deposition of oxide films by the use of such targets of pure metals, the atmosphere is purified to a 99.999% or higher purity and comprises 100% to 90% oxygen in which deposition of the oxide films is carried out with a lower acceleration voltage at a lower deposition speed of the order of ¼ of the above embodiments.

The application of the present invention is not limited to the above examples but applicable for integrated circuits utilizing the capacitors of the present invention, transistors of inversed-stagger type, vertical channel transistors, other types of insulated gate field effect transistors formed within a single crystalline silicon semiconductor substrate and so forth. The capacitances can be formed into multi-layered structure or vertical type structure in which the dielectric film is sandwiched by a pair of electrodes in a lateral direction. The capacitors of the present invention can be used for dynamic memories.

What is claimed is:

1. A semiconductor memory device comprising:

a semiconductor substrate;

a pair of field effect transistors associated with said semiconductor substrate wherein each source of said transistors shares a common impurity doped region formed in a plateau elevated from said semiconductor substrate and each gate electrode of said transistors is formed over each channel region of said transistors;

a first capacitor connected to a drain of one of said transistors;

a second capacitor connected to a drain of another one of said transistors, wherein said each of said first and second capacitors comprises a pair of electrodes and a dielectric layer interposed therebetween, said dielectric layer comprising a ferroelectric material, and wherein each of said first and second capacitors is located over said gate electrode of the corresponding transistor so as to completely overlap said gate electrode.

2. A semiconductor memory device according to claim 1 wherein said ferroelectric material is selected from the group consisting of barium titanate and lead titanate.

3. A semiconductor memory device comprising:

a semiconductor substrate;

a pair of field effect transistors associated with said semiconductor substrate wherein each source of said transistors shares a common impurity doped region formed in a plateau elevated from said semiconductor substrate and each gate electrode of said transistors is formed over each channel region of said transistors;

a first capacitor connected to a drain of one of said transistors;

a second capacitor connected to a drain of another one of said transistors, and wherein each of said first and second capacitors is located over said gate electrode of the corresponding transistor so as to completely overlap said gate electrode.

4. A semiconductor memory device according to claim 3 wherein said each channel region of said transistors is formed in said semiconductor substrate and between said plateau and each of said drain regions.

5. A semiconductor memory device including at least first and second insulated gate field effect transistors, said device comprising:

a semiconductor substrate having a first surface and a plateau elevated from said first surface;

a first impurity region formed within said plateau as a source of both said first and second transistors;

a pair of second impurity regions formed within said semiconductor substrate with said plateau disposed therebetween as drains of said first and second transistors, respectively;

a pair of capacitors electrically connected to said pair of second impurity regions, respectively;

a pair of channel regions formed within said substrate between said plateau and said pair of second impurity regions, respectively; and a pair of gate electrodes adjacent to said channel regions, respectively, wherein each of said first and second capacitors comprises a pair of electrodes and a dielectric layer interposed therebetween, said dielectric layer comprising a ferroelectric material, and wherein each of said first and second capacitors is located over said gate electrode of the corresponding transistor so as to completely overlap said gate electrode.

6. A semiconductor device according to claim 5 wherein each of said capacitors extends beyond the associated channel region and the associated gate electrode.

7. A semiconductor memory device comprising:

a semiconductor substrate;

a pair of field effect transistors associated with said semiconductor substrate, each of which comprises source and drain regions, a channel region therebetween, and a gate electrode over the channel region wherein the source regions of the pair of field effect transistors are formed in a same impurity region in a plateau elevated from said semiconductor substrate;

a first capacitor connected to a drain region of one of the drains of the pair of transistors;

a second capacitor connected to the other one of the drains of the pair of transistors;

wherein each of said first and second capacitor has a dielectric layer, and wherein each of said first and second capacitors is located over said gate electrode of the corresponding transistor so as to completely overlap said gate electrode.

8. The semiconductor memory device according to claim 7 wherein said dielectric layer comprises tantalum oxide.

9. The semiconductor memory device according to claim 7 wherein said dielectric layer comprises titanium oxide.

10. The semiconductor memory device according to claim 7 wherein said dielectric layer comprises a material selected from the group consisting of silicon nitride, tantalum nitride and titanium nitride.

11. The semiconductor memory device according to claim 7 wherein said dielectric layer comprises a material selected from the group consisting of tantalum oxide, titanium oxide, barium titanate and lead titanate.

12. A semiconductor memory device including at least first and second insulated gate field effect transistors, said device comprising:

a semiconductor substrate having a first surface and a plateau elevated from said first surface;

a first impurity region formed within said plateau as a source of both said first and second transistors;

a pair of second impurity regions formed within said semiconductor substrate with said plateau disposed therebetween as drains of said first and second transistors, respectively;

a pair of capacitors electrically connected to said pair of second impurity regions, respectively;

a pair of channel regions formed within said substrate between said plateau and said pair of second impurity regions, respectively; and a pair of gate electrodes adjacent to said channel regions, respectively, wherein each of said first and second capacitors comprises a pair of electrodes and a dielectric layer interposed therebetween, and wherein each of said first and second capacitors is located over said gate electrode of the corresponding transistor so as to completely overlap said gate electrode.

13. The semiconductor memory device according to claim 12 wherein said dielectric layer comprises tantalum oxide.

14. The semiconductor memory device according to claim 12 wherein said dielectric layer comprises titanium oxide.

15. The semiconductor memory device according to claim 12 wherein said dielectric layer comprises a material selected from the group consisting of silicon nitride, tantalum nitride and titanium nitride.

16. A semiconductor memory device comprising:

a semiconductor substrate;

a pair of field effect transistors associated with said semiconductor substrate wherein each source of said transistors shares a common impurity region formed in plateau elevated from said semiconductor substrate and each gate electrode of said transistors is formed over each channel region of said transistors;

a first capacitor connected to a drain of one of said transistors;

a second capacitor connected to a drain of another one of said transistors, wherein each of said first and second capacitors comprises a pair of electrodes and a tantalum oxide layer interposed therebetween, and wherein each of said first and second capacitors is located over said gate electrode of the corresponding transistor so as to completely overlap said gate electrode.

17. A semiconductor memory device according to claim 16 wherein each channel region of said transistors is formed in said semiconductor substrate and between said plateau and each of said drain regions.

18. A semiconductor memory device comprising:

a semiconductor substrate;

a pair of field effect transistors associated with said semiconductor substrate wherein each source of said transistors shares a common impurity region formed in plateau elevated from said semiconductor substrate and each gate electrode of said transistors is formed over each channel region of said transistors;

a first capacitor connected to a drain region of said drain regions of said pair of transistors;

a second capacitor connected to the other one of said drains of said pair of transistors;

wherein each of said first and second capacitors has a dielectric layer comprising tantalum oxide, and wherein each of said first and second capacitors is located over said gate electrode of the corresponding transistor so as to completely overlap said gate electrode.

19. A semiconductor memory device according to claim 18 wherein each channel region of said transistors is formed in said semiconductor substrate and between said plateau and each of said drain regions.

* * * * *